United States Patent
Zhang et al.

(10) Patent No.: US 11,550,170 B2
(45) Date of Patent: Jan. 10, 2023

(54) OPTICAL ADJUSTABLE FILTER SUB-ASSEMBLY

(71) Applicant: II-VI Delaware, Inc, Wilmington, DE (US)

(72) Inventors: Li Zhang, Shanghai (CN); Bangjia Wu, Chengdu (CN); Huiping Li, Shanghai (CN)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

(21) Appl. No.: 17/444,534

(22) Filed: Aug. 5, 2021

(65) Prior Publication Data

US 2021/0382334 A1    Dec. 9, 2021

Related U.S. Application Data

(62) Division of application No. 15/968,977, filed on May 2, 2018, now Pat. No. 11,194,180.

(30) Foreign Application Priority Data

Nov. 20, 2017 (CN) .......................... 201711160529.X (51) Int. Cl.
*G02F 1/01* (2006.01)
*H01L 23/34* (2006.01)
(Continued)

(52) U.S. Cl.
CPC ............ *G02F 1/0147* (2013.01); *B32B 7/023* (2019.01); *B32B 17/10477* (2013.01);
(Continued)

(58) Field of Classification Search
CPC . B32B 7/023; B32B 17/10477; G02F 1/0121; G02F 1/0147; G02F 2203/055;
(Continued)

(56) References Cited

U.S. PATENT DOCUMENTS 6,985,281 B2   1/2006   Wagner et al.
7,061,659 B2   6/2006   Ling et al.
(Continued)

FOREIGN PATENT DOCUMENTS

CN     1653367 A    8/2005
CN   102870037 A    1/2013

OTHER PUBLICATIONS

Office Action dated Sep. 23, 2021 in Chinese Patent Application No. 201711160529.X and English translation.

*Primary Examiner* — Allan R Wilson
(74) *Attorney, Agent, or Firm* — Blank Rome LLP (57) ABSTRACT

A method may include thinning a silicon wafer to a particular thickness. The particular thickness may be based on a passband frequency spectrum of an adjustable optical filter. The method may also include covering a surface of the silicon wafer with an optical coating. The optical coating may filter an optical signal and may be based on the passband frequency spectrum. The method may additionally include depositing a plurality of thermal tuning components on the coated silicon wafer. The plurality of thermal tuning components may adjust a passband frequency range of the adjustable optical filter by adjusting a temperature of the coated silicon wafer. The passband frequency range may be within the passband frequency spectrum. The method may include dividing the coated silicon wafer into a plurality of silicon wafer dies. Each silicon wafer die may include multiple thermal tuning components and may be the adjustable optical filter.

12 Claims, 7 Drawing Sheets

(51) Int. Cl.
  *H01L 21/02*    (2006.01)
  *H01L 31/0304*  (2006.01)
  *H01L 29/66*    (2006.01)
  *H01L 29/20*    (2006.01)
  *B32B 7/023*    (2019.01)
  *B32B 17/10*    (2006.01)
  *H01L 21/66*    (2006.01)

(52) U.S. Cl.
  CPC ...... *G02F 1/0121* (2013.01); *H01L 21/02005* (2013.01); *H01L 21/02024* (2013.01); *H01L 21/02104* (2013.01); *H01L 22/10* (2013.01); *H01L 23/34* (2013.01); *H01L 23/345* (2013.01); *H01L 29/20* (2013.01); *H01L 29/66007* (2013.01); *H01L 31/0304* (2013.01); *G02F 2203/055* (2013.01)

(58) Field of Classification Search
  CPC ......... H01L 21/02005; H01L 21/02024; H01L 21/02104; H01L 22/10; H01L 23/34; H01L 23/345; H01L 29/20; H01L 29/66007
  See application file for complete search history.

(56) References Cited

U.S. PATENT DOCUMENTS

| | | |
|---|---|---|
| 2005/0105184 A1 | 5/2005 | Ma et al. |
| 2005/0200835 A1 | 9/2005 | Moy et al. |
| 2006/0051010 A1 | 3/2006 | Chu et al. |
| 2009/0294779 A1 | 12/2009 | Ida et al. |
| 2015/0104199 A1 | 4/2015 | Ye et al. |
| 2015/0309339 A1* | 10/2015 | Yu .................. G02F 1/0147 359/288 |
| 2016/0112776 A1 | 4/2016 | Kim |

* cited by examiner

OPTICAL ADJUSTABLE FILTER SUB-ASSEMBLY

CROSS-REFERENCE TO RELATED APPLICATION

This patent application is a divisional of U.S. patent application Ser. No. 15/968,977, filed May 2, 2018, which claims benefit of and priority to Chinese Patent Application for Invention No. 201711160529.X filed Nov. 20, 2017, both of which are incorporated herein by reference in their entireties.

The embodiments discussed herein are related to adjustable optical filters and adjustable optical filter sub-assemblies.

BACKGROUND

An adjustable optical filter may allow optical signals at different frequencies to be used within an optical communication system. A frequency spectrum of light filtered by the adjustable optical filter may be adjusted by modifying a temperature of a silicon wafer die in the adjustable optical filter. Additionally, the adjustable optical filter may be coupled to a substrate in a sub-assembly to thermally isolate the adjustable optical filter.

The subject matter claimed herein is not limited to embodiments that solve any disadvantages or that operate only in environments such as those described above. Rather, this background is only provided to illustrate one example technology where some embodiments described herein may be practiced.

SUMMARY

In one embodiment, a method may include thinning a silicon wafer to a particular thickness. The particular thickness may be based on a passband frequency spectrum of an adjustable optical filter. The method may also include covering a surface of the silicon wafer with an optical coating. The optical coating may filter an optical signal and may be based on the passband frequency spectrum. The method may additionally include depositing thermal tuning components on the coated silicon wafer. The thermal tuning components may adjust a passband frequency range of the adjustable optical filter by adjusting a temperature of the coated silicon wafer. The passband frequency range may be within the passband frequency spectrum. The method may include dividing the coated silicon wafer into a plurality of silicon wafer dies. Each silicon wafer die may include multiple thermal tuning components and may be the adjustable optical filter.

In one embodiment, a system may include an adjustable optical filter. The adjustable optical filter may include a silicon wafer die having a thickness that is based on a passband frequency spectrum of the adjustable optical filter. The adjustable optical filter may also include an optical coating disposed on a first surface of the silicon wafer die. The optical coating may filter an optical signal and may be based on the passband frequency spectrum. The adjustable optical filter may additionally include a ring heater integrated with the silicon wafer die. The ring heater may adjust a temperature of the silicon wafer die based on an electrical signal to adjust a passband frequency range of the adjustable optical filter. The passband frequency range may be within the passband frequency spectrum. The adjustable optical filter may include a thermal contact pad integrated with the silicon wafer die and coupled to the ring heater. The thermal contact pad may receive the electrical signal and pass the electrical signal to the ring heater. The adjustable optical filter may also include a thermistor integrated with the silicon wafer die. The thermistor may monitor the temperature of the silicon wafer die. The electrical signal may be modified based on the monitored temperature. The system may also include a substrate thermally isolated from the silicon wafer die. The substrate may include a signal trace electrically coupled to the thermal contact pad. The signal trace may carry the electrical signal.

In one embodiment, an adjustable optical filter may include an optical filter die including a polished first surface and a polished second surface opposite the polished first surface. The optical filter die may include a thickness that is based on a passband frequency spectrum of the adjustable optical filter. The adjustable optical filter may also include an optical coating disposed on the polished first surface of the optical filter die. The optical coating may filter an optical signal and may be based on the passband frequency spectrum. The adjustable optical filter may additionally include a ring heater integrated with the optical filter die. The ring heater may adjust a temperature of the optical filter die based on an electrical signal to adjust a passband frequency range of the adjustable optical filter. The passband frequency range may be within the passband frequency spectrum. The adjustable optical filter may include a thermal contact pad integrated with the optical filter die and coupled to the ring heater. The thermal contact pad may receive the electrical signal and pass the electrical signal to the ring heater. The adjustable optical filter may also include a thermistor integrated with the optical filter die. The thermistor may monitor the temperature of the optical filter die. The electrical signal may be modified based on the monitored temperature.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE FIGURES

To further clarify the above and other advantages and features of the present invention, a more particular description of the invention will be rendered by reference to specific embodiments thereof which are illustrated in the appended drawings. It is appreciated that these drawings depict only typical embodiments of the invention and are, therefore, not to be considered limiting of its scope. The invention will be described and explained with additional specificity and detail through the use of the accompanying drawings in which.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

Generally, the present technology relates to an adjustable optical filter and an adjustable optical filter sub-assembly. Optical communication systems may operate within a particular frequency range in each direction of communication. Filtering optical signals may improve performance of the optical communication system and may reduce a number of errors introduced during processing of the optical signal.

According to one or more embodiments described in the present disclosure, an adjustable optical filter may be manufactured using a silicon wafer, an optical coating, multiple thermal components, and a thermistor. In some embodiments, the silicon wafer may be thinned to a particular thickness. In these and other embodiments, an optical coating may be applied to a surface of the silicon wafer. In these and other embodiments, multiple ring heaters and thermal contact pads may be deposited on the optical coating. Additionally or alternatively, the adjustable optical filter may be manufactured using glass materials instead of a silicon wafer. In some embodiments, multiple thermistors may be integrated with the optical coating. In these and other embodiments, the silicon wafer including the optical coating may be diced into multiple adjustable optical filters in which each adjustable optical filter includes a ring heater, at least one thermal contact pad, and at least one thermistor integrated with the optical coating.

In some embodiments, the silicon wafer may be thinned to a particular thickness based on the frequency range that is to pass through the adjustable optical filter. In these and other embodiments, the optical coating applied to the surface of the silicon wafer may be configured to provide additional filtering of the optical signal. Additionally or alternatively, the ring heater and the thermal contact pads on each adjustable optical filter may be electrically coupled and the ring heater may be configured to adjust a temperature of the silicon wafer within each adjustable optical filter based on an electrical signal received by the thermal contact pads. In some embodiments, the thermistor on each adjustable optical filter may be integrated with the optical coating to monitor the temperature of the silicon wafer within the adjustable optical filter to which each thermistor is included.

Figure 1:
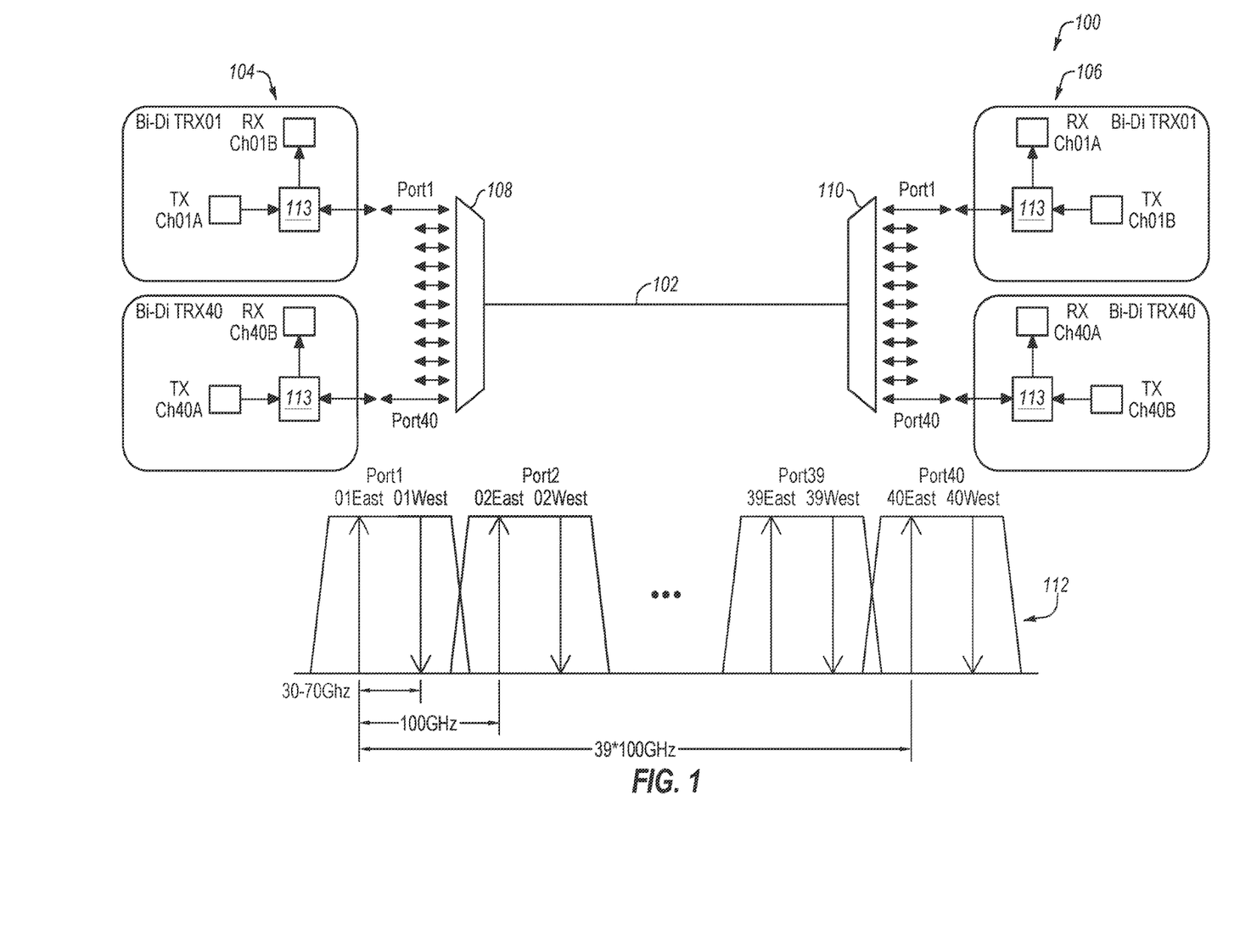
FIG. 1 illustrates an example optical communication system.

FIG. 1 illustrates an example optical communication system 100 (hereinafter 'system 100'), arranged in accordance with at least one embodiment described herein. In FIG. 1, a direction from left to right through the optical fiber 102 is arbitrarily referred to as east, while a direction from right to left through the optical fiber 102 is arbitrarily referred to as west. East and west as used herein do not necessarily refer to cardinal directions but instead are a convenient shorthand to designate relative directions and/or orientation of components relative to each other.

In the example of FIG. 1, the system 100 includes forty communication modules 104 and 106 at each of two ends of the optical fiber 102. In particular, in the example of FIG. 1, the system 100 includes forty communication modules 104 at a west end of the optical fiber 102 and forty communication modules 106 at the east end of the optical fiber 102. In other examples, the system 100 may include some other number of communication modules 104 and 106 at each of the two ends of the optical fiber 102.

At each end of the optical fiber 102, a first and last of the communication modules 104 and 106 (e.g., communication module 1 and communication module 40) are depicted and respectively labeled "Bi-Di TRX01" and "Bi-Di TRX40". Due to space constraints in the drawings, communication modules two through thirty nine are not illustrated at either end of the optical fiber 102.

In an example embodiment, each communication module 104 and 106 includes a transmitter configured to emit an optical signal that is representative of an electrical signal received from a host device at a designated frequency (and wavelength) that is different than a designated frequency (and wavelength) of other optical signals emitted by transmitters of other communication modules 104 and 106 in the system 100. The various designated frequencies (and corresponding wavelengths) may be referred to as channels. Each communication module additionally includes a receiver configured to receive an optical signal in a particular one of the channels.

In FIG. 1, each transmitter is labeled "TX" and each receiver is labeled "RX". The channel assignments for each transmitter and receiver may be labeled according to the format "ChXXY", where "XX" is a placeholder for a number of the communication module 104 and 106 in which the transmitter or receiver is included (e.g., "01" for the first communication module 104 and 106 or "40" for the last communication module 104 and 106) and "Y" is a placeholder for the transmission direction of the channel (e.g., "A" for eastbound optical signals or "B" for westbound optical signals). Thus, the transmitter in the first communication module 104 at the west end of the optical fiber 102 is labeled "TX Ch01A" where TX designates the component as a transmitter and "Ch01A" designates the particular channel "Ch" assignment for the transmitter of the first communication module "01" transmitting in the eastbound direction "A." The above naming convention may analogously be applied to other channel assignments for other transmitters and receivers in the system 100.

The system 100 additionally includes an optical multiplexer/demultiplexer (hereinafter 'Mux/Demux') 108 and 110 at each end of the optical fiber 102 between the corresponding end of the optical fiber 102 and the corresponding communication modules 104 or 106. In an example embodiment, each of the Mux/Demux 108 and 110 may include a 100 gigahertz (GHTz) Mux/Demux.

In the example of FIG. 1, each Mux/Demux 108 and 110 includes forty module-side ports and a single fiber-side port. More generally, each Mux/Demux 108 and 110 may include two or more module-side ports, the specific number of module-side ports depending on the number of communication modules 104 and 106 and/or the number of channels in the system 100.

In operation, the left Mux/Demux 108 is configured to receive forty eastbound optical signals on its forty module-side ports from the forty left communication modules 104 and to spatially combine (e.g., multiplex) the forty eastbound optical signals for output through its fiber-side port to the optical fiber 102. The forty spatially combined eastbound optical signals are transmitted eastward through the optical fiber 102 to the right Mux/Demux 110. The right Mux/Demux 110 is configured to receive the forty spatially combined eastbound optical signals from the optical fiber 102 through its fiber-side port and to spatially separate (e.g., demultiplex) out the individual forty eastbound optical signals. The forty eastbound optical signals are output through the forty module side ports of the right Mux/Demux 110 such that each of the forty eastbound optical signals is provided to a different one of the forty right communication modules 106.

Analogously, the right Mux/Demux 110 is configured to receive forty westbound optical signals on its forty module-side ports from the forty right communication modules 106 and to spatially combine (e.g., multiplex) the forty westbound optical signals for output through its fiber-side port to the optical fiber 102. The forty spatially combined westbound optical signals are transmitted westward through the optical fiber 102 to the left Mux/Demux 108. The left Mux/Demux 108 is configured to receive the forty spatially combined westbound optical signals from the optical fiber 102 through its fiber-side port and to spatially separate (e.g., demultiplex) out the individual forty westbound optical signals. The forty westbound optical signals are output through the forty module side ports of the left Mux/Demux 108 such that each of the forty westbound optical signals is provided to a different one of the forty left communication modules 104. Alternatively or additionally, each Mux/Demux 108 and 110 may include a cyclic arrayed waveguide grating (AWG), a common AWG, a thin-film filter (TFF), or other suitable Mux/Demux.

The foregoing example assumes that the left communication modules 104 include a total of forty modules, the right communication modules 106 include a total of forty modules, and each of the left Mux/Demux 108 and the right Mux/Demux 110 includes forty module-side ports. Embodiments described herein can analogously be applied to other systems that may have a different number of communication modules at opposite ends of an optical fiber where a Mux/Demux at each end of the optical fiber may have a different number of module-side ports.

In the system 100 of FIG. 1, each communication module 104 and 106 may include an adjustable optical filter 113 with a narrowband cyclic or periodical filter. The configuration of FIG. 1 may accommodate a higher channel density that allows all eighty channels (assuming forty left communication modules 104 and forty right communication modules 106) to be implemented in the C-band without requiring any changes to either of the two Mux/Demux units 108 and 110 in the system 100.

Each communication module 104 and 106 in the system 100 may include a single input/output port through which an outbound optical signal generated by the transmitter of the communication module 104 and 106 is output, and also through which an inbound optical signal received from the corresponding Mux/Demux 108 and 110 may be received In these and other embodiments, each communication module 104 and 106 may include an adjustable optical filter 113 configured to pass the outbound signal and reflect the inbound signal, or vice versa.

In more detail, FIG. 1 additionally includes a transmission spectrum 112 of each Mux/Demux 108 and 110 along with port and channel assignments in the system 100. In FIG. 1, each eastbound channel is assigned to a different port of each Mux/Demux 108 and 110 and different transmission peak of the transmission spectrum 112 than other eastbound channels, while each westbound channel is assigned to a different port of each Mux/Demux 108 and 110 and different transmission peak of the transmission spectrum 112 than other westbound channels. Additionally, each eastbound channel is paired with a corresponding westbound channel where the two channels in each pair may be spaced by tens of GHz, and both the eastbound channel and the westbound channel are not only assigned to a same optical port, but are also assigned to a same transmission peak of the transmission spectrum 112. In FIG. 1, the eastbound channels may have about one hundred GHz spacing between adjacent eastbound channels, while the westbound channels may also have about one hundred GHz spacing between adjacent westbound channels. The spacing between the eastbound and westbound channel in each pair can be fifty GHz, or generally somewhere between thirty GHz and seventy GHz. More generally, assuming the transmission spectrum 112 of each Mux/Demux 108 and 110 has transmission peaks with a center-to-center spacing between adjacent transmission peaks of Δ GHz, the spacing between the eastbound and westbound channel in each pair can be 0.5*Δ GHz or in a range from 0.3*ΔGHz to 0.7*Δ GHz.

By pairing the eastbound and westbound channels together at tens of GHz spacing between the two channels of the pair, all eighty channels of FIG. 1 can be accommodated in the C-band without replacing legacy components such as each of the Mux/Demux units 108 and 110. In FIG. 1, each eastbound channel in a pair is illustrated as being at a frequency tens of GHz lower than the westbound channel in the pair. In other embodiments, the arrangement is reversed with each westbound channel in the pair being at a frequency tens of GHz lower than the eastbound channel in the pair.

Figure 2A:
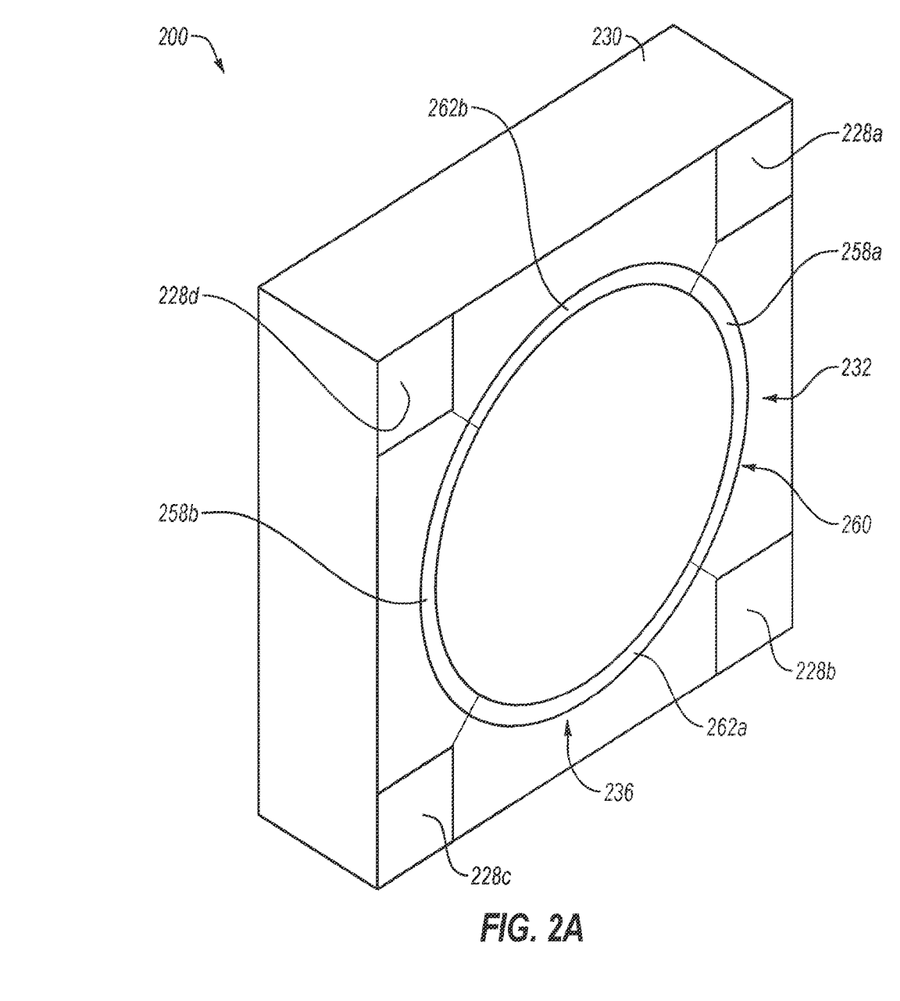
FIG. 2A illustrates a front view of an adjustable optical filter.
Figure 2B:
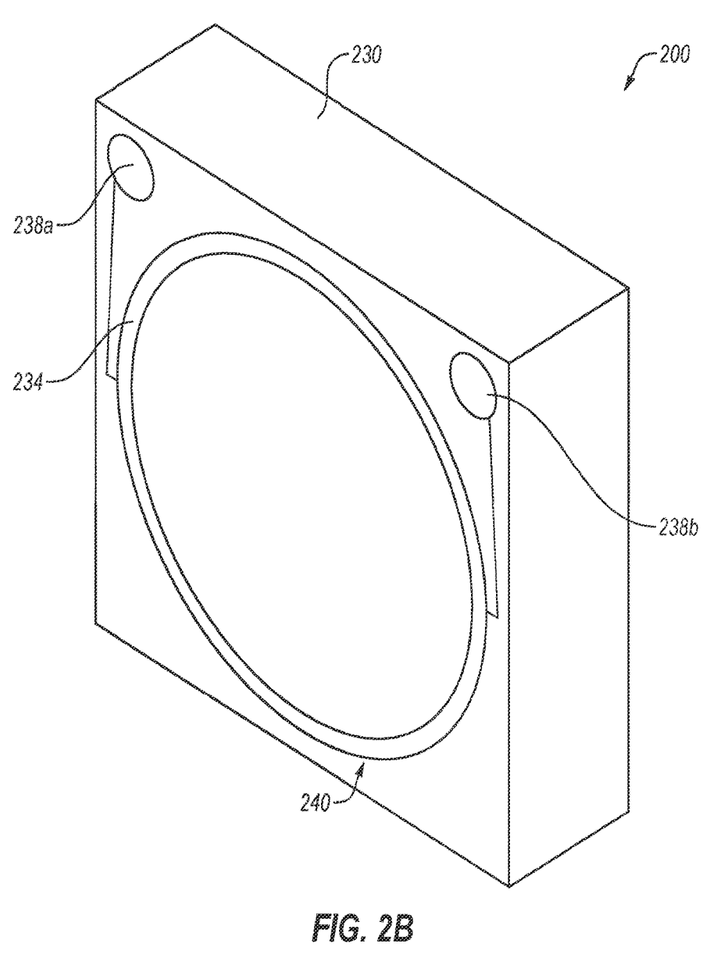
FIG. 2B illustrates a back view of the adjustable optical filter.

FIGS. 2A and 2B are, respectively, a front and a back view of an adjustable optical filter 200. The adjustable optical filter 200 may be the same or similar to the adjustable optical filter 113 discussed above in relation to FIG. 1. With combined reference to FIGS. 2A and 2B, the adjustable optical filter 200 may be employed to filter optical signals. For example, the adjustable optical filter 200 may be configured as a passband filter, a dense wavelength-division multiplexing (DWDM) thin-film filter, an edge filter, or any other suitable optical filter. In some embodiments, the adjustable optical filter 200 may permit a frequency spectrum of the optical signal to pass through the adjustable optical filter 200.

The adjustable optical filter 200 may include an optical filter die 230, an optical coating 232, and a ring heater 234. The adjustable optical filter 200 may also include at least one of thermal contact pad 238a and/or thermal contact pad 238b (collectively 'thermal contact pads 238'). Additionally, the adjustable optical filter 200 may include at least one of thermistor contact pad 228a, thermistor contact pad 228b, thermistor contact pad 228c, and/or thermistor contact pad 228d (collectively 'thermistor contact pads 228'). The adjustable optical filter 200 may include thermistor ring 260, which may include a first thermal conducting portion 258a and a second thermal conducting portion 258b (collectively 'thermal conducting portions 258') along with a first thermal non-conducting portion 262a and a second thermal non-conducting portion 262b (collectively 'thermal non-conducting portions 262').

The optical filter die 230 may include a semiconductor material configured to permit the frequency spectrum of the optical signals to pass through. For example, the optical filter die 230 may include Gallium Arsenide, Indium Phosphide, Silicon, glass, crystal, or any other suitable material. A frequency range of the optical signal that is to pass through the optical filter die 230 may be adjusted by modifying a temperature of the optical filter die 230. The frequency range may be within the frequency spectrum. Likewise, a thickness of the optical filter die may be based on the frequency spectrum that is to pass through the optical filter die 230. For example, the thickness of the optical filter die 230 may be between two micrometers and fifteen millimeters. Additionally, the thickness of the optical filter die 230 may define a cycle of the adjustable optical filter 200. For example, the spectrum of the adjustable optical filter 200 may be periodic, and the cycle may include a free spectrum range (FSR), which may be determined according to equation 1:

$$FSR = (\lambda 2)/(2nL), \quad \text{Equation 1}$$

In equation 1, L may be the thickness of the optical filter die, n may be the refractive index of the optical filter die, and λ may be the wavelength of the optical signal.

The optical filter die 230 may include a first surface 236 (shown, e.g., in FIG. 2A) and a second surface 240 (shown, e.g., in FIG. 2B) opposite the first surface 236. The first surface 236 and the second surface 240 may be positioned parallel to each other. The first surface 236 and the second surface 240 being positioned parallel may promote proper filtering of the optical signals. Similarly, the first surface 236 and/or the second surface 240 may be polished to increase quality of the first surface 236 and/or the second surface 240. Additionally, polishing the first surface 236 and/or the second surface 240 may ensure that the first surface 236 and the second surface 240 are parallel.

The optical coating 232 (shown, e.g., in FIG. 2A) may be disposed on the first surface 236 of the optical filter die 230. In some embodiments, the optical coating 232 may be disposed on the first surface 236 and the second surface 240 of the optical filter die 230. The frequency range of the optical signal that is to pass through the optical coating 232 may be based on the optical coating 232. For example, the optical coating 232 include a reflectivity value which may reflect portions of the optical signals outside of the frequency range that is to pass through the adjustable optical filter 200. In some embodiments, the optical coating 232 may be deposited on the first surface 236 and/or second surface of the optical filter die 230 as a thin film deposit.

The ring heater 234 (shown, e.g., in FIG. 2B) may be integrated with the optical filter die 230 and may be disposed on the first surface 236 and/or the second surface 240 of the optical filter die 230. The ring heater 234 may be configured to adjust the temperature of the optical filter die 230 so as to modify the frequency range of the optical signals that is to pass through the adjustable optical filter 200. For example, the ring heater 234 may adjust the temperature of the optical filter die 230 based on one or more electrical signals received from the thermal contact pads 238. Additionally or alternatively, the ring heater 234 may be configured to adjust the temperature of the optical coating 232 which may adjust the frequency range of the optical signals that pass through the adjustable optical filter 200.

The thermal contact pads 238 (shown, e.g., in FIG. 2B) may be integrated with the optical filter die 230. In some embodiments, the thermal contact pads 238 may be located on the second surface 240 of the optical filter die 230. Additionally or alternatively, the thermal contact pads may be located on both the first surface 236 and the second surface 240 of the optical filter die 230. In these and other embodiments, the thermal contact pads 238 may be integrated with the optical coating 232.

The thermal contact pads 238 may be electrically coupled to the ring heater 234 and to an external device. The thermal contact pads 238 may receive the one or more electrical signals from the external device. The thermal contact pads 238 may pass the electrical signal to the ring heater 234.

The thermistor contact pads 228 (shown, e.g., in FIG. 2A) may be integrated with the optical filter die 230. The thermistor contact pads 228 may be located on the first surface 236 of the optical filter die 230. Additionally or alternatively, the thermistor contact pads 228 may be located on the second surface 240 of the optical filter die 230. In some embodiments, the thermistor contact pads 228 may be located at different corners of the optical filter die 230. Alternatively, the thermistor contact pads 228 may be located along an edge of the optical filter die 230. Additionally or alternatively, the thermistor contact pads 228 may be omitted and a single thermistor configured to monitor a temperature of the optical filter die 230 may be attached at a corner of optical filter die 230. The thermistor contact pads 228 may include Gold Tin (AuSn) solder. In some embodiments, the ring heater 234 and the thermistor contact pads 228 may be located on the same surface of the optical filter die 230. For example, both the ring heater 234 and the thermistor contact pads 228 may be located on the first surface 236 of the optical filter die 230.

The thermistor ring 260 (shown e.g., in FIG. 2A) may be integrated with the optical filter die 230. The thermistor ring 260 may be located on the first surface 236 of the optical filter die 230. The thermistor ring 260 may be aligned with the ring heater 234. The thermistor ring 260 may include thin film resistor materials. For example, the thermistor ring 260 may include platinum, tungsten, tantalum nitride, or any other suitable thin film resistor material. The thermal conducting portions 258 may include thermally conductive materials and the thermal non-conducting portions 262 may include thermally non-conductive materials. For example, the thermal conducting portions 258 may include platinum and the thermally non-conducting portion may include tantalum nitride. As the temperature of the optical filter die 230 increases or decreases, a resistance of the thermal conducting portions 258 may change accordingly and a resistance of the thermal non-conducting portions 262 may remain constant.

The thermistor ring 260 may be configured to monitor the temperature of the optical filter die 230 and/or the optical coating 232. The thermal conducting portions 258 and the thermal non-conducting portions 262 may be positioned in a bridge configuration. For example, a thermistor contact pad 228 (e.g., thermistor contact pad 228d) may be electrically coupled to both the second thermal conducting portion 258b and the second thermal non-conducting portion 262b, a thermistor contact pad 228 (e.g., thermistor contact pad 228c) may be electrically coupled to both the second thermal conducting portion 258b and the first thermal non-conducting portion 262a, a thermistor contact pad 228 (e.g., thermistor contact pad 228b) may be electrically coupled to both the first thermal conducting portion 258a and the first thermal non-conducting portion 262a, and a thermal contact pad (e.g., thermistor contact pad 228a) may be electrically coupled to both the first thermal conducting portion 258a and the second thermal non-conducting portion 262b.

In some embodiments, a first thermistor contact pad 228 may be provided a reference voltage signal, a second thermistor contact pad 228 may be electrically grounded, a third thermistor contact pad 228 may be configured to monitor a first voltage, and a fourth thermistor contact pad 228 may be configured to monitor a second voltage. The temperature of the optical filter die 230 may be determined based on a voltage difference between the first voltage and the second voltage. The voltage difference between the first voltage and the second voltage may change as the temperature of the optical filter die 230 increases or decreases. The voltage difference between the first voltage and the second voltage may change as the resistance of the thermal conducting portions 258 increase or decrease based on the temperature of the optical filter die increasing or decreasing.

For example, thermistor contact pad 228d may be configured as the first thermistor contact pad 228, thermistor contact pad 228b may be configured as the second thermistor contact pad 228, thermistor contact pad 228a may be configured as the third thermistor contact pad 228, and thermistor contact pad 228c may be configured as the fourth thermistor contact pad 228. Thermistor contact pad 228d may be provided the reference voltage signal, thermistor contact pad 228b may be electrically grounded, thermistor contact pad 228a may be configured to monitor the first voltage, and thermistor contact pad 228c may be configured to monitor the second voltage. The first voltage may change as the resistance of the first thermally conducting portion 258a increases or decreases based on the temperature of the optical filter die 230 increasing or decreasing. Likewise, the second voltage may change as the resistance of the second thermally conducting portion 258b increases or decreases based on the temperature of the optical filter die 230 increasing or decreasing.

Figure 3:
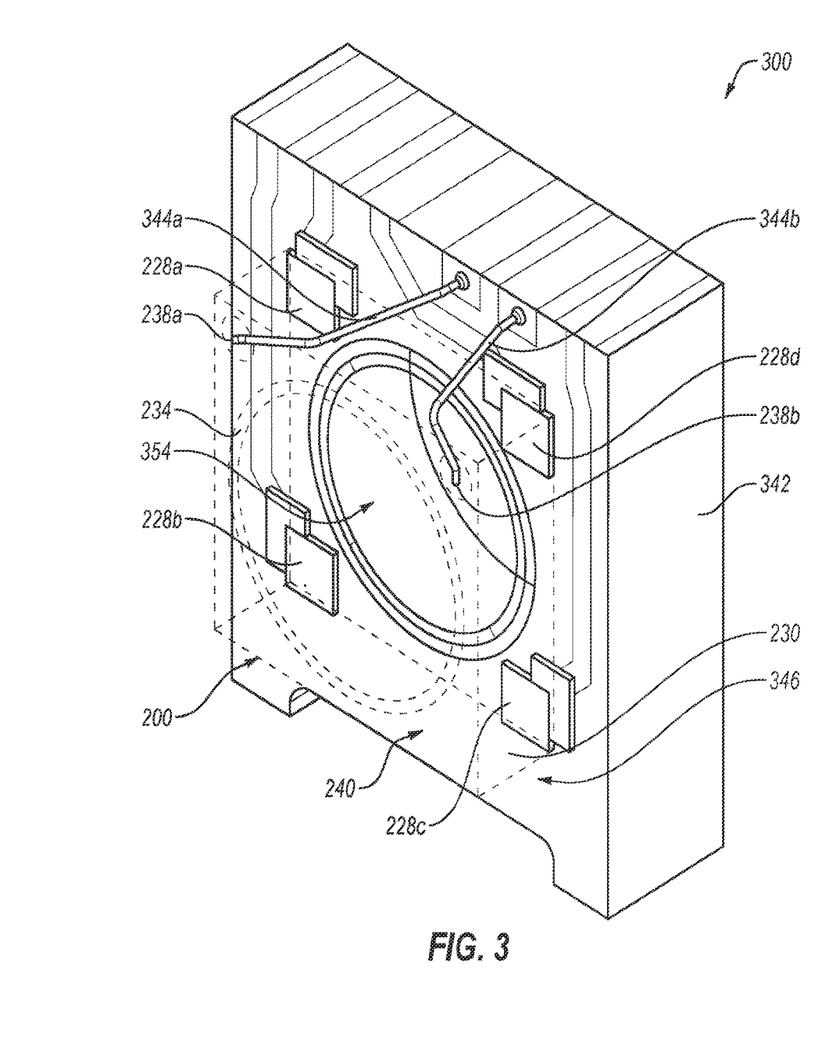
FIG. 3 illustrates an adjustable optical filter sub-assembly.

FIG. 3 illustrates an adjustable optical filter sub-assembly 300, arranged in accordance with at least one embodiment described herein. The adjustable optical filter sub-assembly 300 may include an adjustable optical filter 200 and a substrate 342.

The adjustable optical filter 200 may be the same or similar to the adjustable optical filter 113 and 200 discussed above in relation to FIGS. 1-2B. For example, the adjustable optical filter 200 may include an optical filter die 230; an optical coating 232; a ring heater 234; at least one of thermal contact pad 238a and thermal contact pad 238b (collectively 'thermal contact pads 238'); at least one of thermistor contact pad 228a, thermistor contact pad 228b, thermistor contact pad 228c, and/or thermistor contact pad 228d (collectively 'thermistor contact pads 228'), and thermistor ring 260.

The optical filter die 230 may be the same or similar to the optical filter die 230 discussed above in relation to FIGS. 2A and 2B. Likewise, the optical coating 232 may be the same or similar to the optical coating 232 discussed above in relation to FIGS. 2A and 2B. Additionally, the ring heater 234 may be the same or similar to the ring heater 234 discussed above in relation to FIGS. 2A and 2B. The thermal contact pads 238 may be the same or similar to the thermal contact pads 238 discussed above in relation to FIGS. 2A and 2B. Likewise, the thermistor contact pads 228 may be the same or similar to the thermistor contact pads 228 discussed above in relation to FIGS. 2A and 2B. Additionally, the thermistor ring 260 may be the same or similar to the thermistor ring 260 discussed above in relation to FIGS. 2A and 2B.

The substrate 342 may be employed so as to thermally isolate the adjustable optical filter 200. In some embodiments, the substrate 342 may include a low thermal conductivity material. For example, the substrate 342 may include Zirconia ceramic (ZrO), fused silica, glass, or any other appropriate thermally isolating material.

The substrate 342 may include at least one of signal trace 344a and signal trace 344b (collectively 'signal traces 344'). The signal traces 344 may be electrically coupled to the thermal contact pads 238 and to additional signal traces located on the substrate 342. The signal traces 344 may be employed to provide one or more electrical signals to the thermal contact pads 238. The one or more electrical signals may be provided to the ring heater 234 to adjust a temperature of the optical filter die 230 and/or the optical coating 232 so as to modify the frequency range of the optical signals that is to pass through the adjustable optical filter 200. The signal traces 344 may include gold, copper, tin, or any other appropriate material for providing electrical signals. Additionally, the signal traces 344 may be used for bonding the adjustable optical filter 200 to the substrate 342.

The substrate 342 may define a hole 354 that is optically aligned with the ring heater 234 and/or the thermistor ring 260 located on the adjustable optical filter 200. The hole 354 defined by the substrate 342 may permit the optical signals to pass to or from the adjustable optical filter 200.

The adjustable optical filter 200 may be located on a front surface 346 of the substrate 342. Likewise, the adjustable optical filter 200 may be positioned parallel to the substrate 342 so that a first surface 236 and a second surface 240 of the optical filter die 230 are positioned parallel to the front surface 346 of the substrate 342.

The adjustable optical filter 200 may be bonded to the substrate 342 in a manner that thermally isolates the adjustable optical filter 200 from the substrate 342. In some embodiments, the thermistor contact pads 228 of the adjustable optical filter 200 may be bonded to the substrate 342 so as to create an air gap between the optical filter die 230, the optical coating 232, and the ring heater 234 of the adjustable optical filter 200. For example, the thermistor contact pads 228 may include a thickness of 5-10 μm which may create an air gap of greater than 5 μm between the adjustable optical filter 200 and the substrate 342.

Thermally isolating the adjustable optical filter 200 from the substrate 342 and/or other devices may reduce power consumption of the adjustable optical filter sub-assembly 300. Likewise, thermally isolating the adjustable optical filter 200 may permit a more simplified design and lower production cost of the adjustable optical filter 200, which may not include a fragile membrane structure which may increase mechanical stability of the adjustable optical filter 200.

Figure 4:
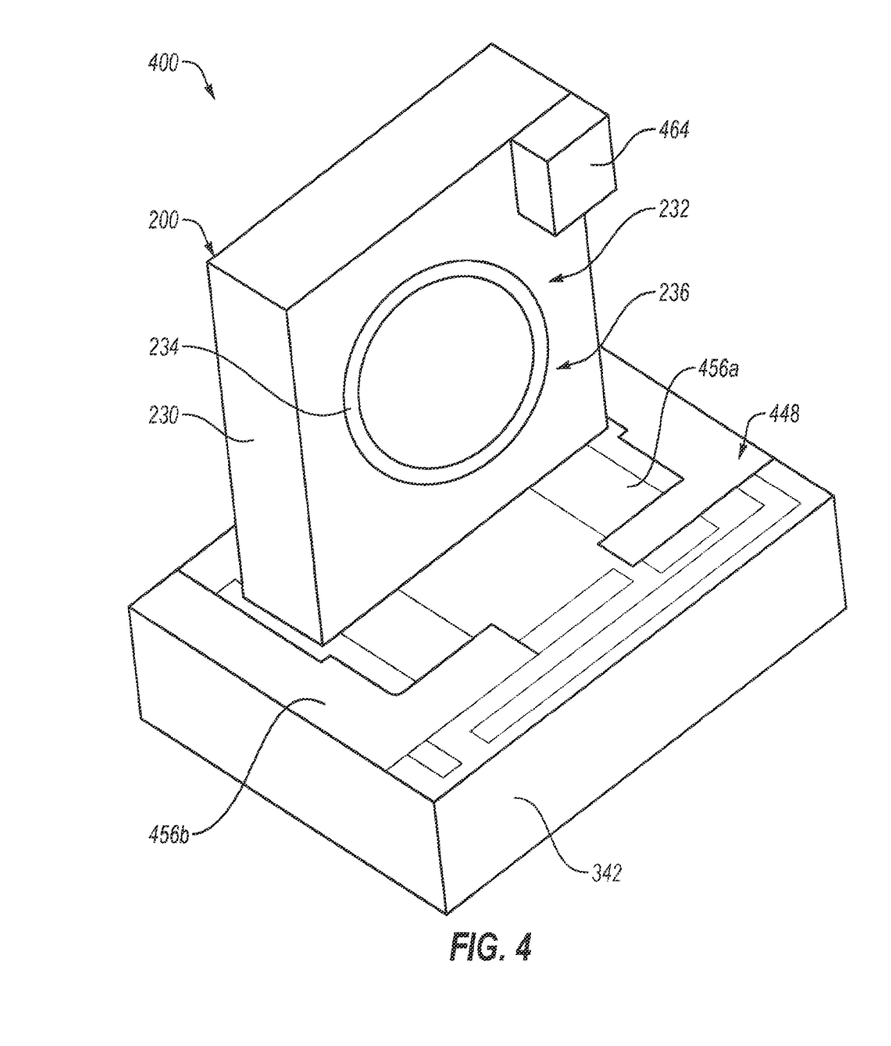
FIG. 4 illustrates another adjustable optical filter sub-assembly.

FIG. 4 illustrates another adjustable optical filter sub-assembly 400, arranged in accordance with at least one embodiment described herein. The adjustable optical filter sub-assembly 400 may include an adjustable optical filter 200 and a substrate 342.

The adjustable optical filter 200 may include various components that are the same or similar to various components of the adjustable optical filter 113 and 200 discussed above in relation to FIGS. 1-2B. For example, the adjustable optical filter 200 may include an optical filter die 230; an optical coating 232; a ring heater 234; and at least one of thermal contact pad 238a and thermal contact pad 238b (collectively 'thermal contact pads 238'). Additionally, the adjustable optical filter 200 may include a thermistor 464.

The optical filter die 230 may be the same or similar to the optical filter die 230 discussed above in relation to FIGS. 2A and 2B. Likewise, the optical coating 232 may be the same or similar to the optical coating 232 discussed above in relation to FIGS. 2A and 2B. Additionally, the ring heater 234 may be the same or similar to the ring heater 234 discussed above in relation to FIGS. 2A and 2B. The thermal contact pads 238 may be the same or similar to the thermal contact pads 238 discussed above in relation to FIGS. 2A and 2B.

The thermistor 464 may be integrated with the optical filter die 230. The thermistor 464 may be located on the first surface 236 of the optical filter die 230. In some embodiments, the thermistor 464 may be located at a corner of the optical filter die 230. Alternatively, the thermistor 464 may be located along an edge of the optical filter die 230. The thermistor 464 may be configured to monitor the temperature of the optical filter die 230 and/or the optical coating 232. For example, a resistance of the thermistor 464 may increase or decrease as the temperature of the optical filter die increases or decreases. In some embodiments, the thermistor 464 may be configured as a negative temperature coefficient (NTC) thermistor.

The substrate 342 may be employed so as to thermally isolate the adjustable optical filter 200. In some embodiments, the substrate 342 may include a low thermal conductivity material. For example, the substrate 342 may include Zirconia ceramic (ZrO), fused silica, glass, or any other appropriate thermally isolating material.

The substrate 342 may include at least one of signal trace 456a and signal trace 456b (collectively 'signal traces 456') located on a top surface 448 of the substrate 342. The signal traces 456 may be electrically coupled to the thermal contact pads 238. For example, the signal traces 456 may be electrically coupled to the thermal contact pads 238 using silver glue, solder preform, or any other suitable material for electrically coupling the signal traces 456 to the thermal contact pads 238. The signal traces 456 may be employed to provide one or more electrical signals to the thermal contact pads 238. The one or more electrical signals may be provided to the ring heater 234 which may adjust a temperature of the optical filter die 230 and/or the optical coating 232 so as to modify the frequency range of the optical signals that is to pass through the adjustable optical filter 200. The signal traces 456 may include gold, copper, tin, or any other appropriate material for providing electrical signals Additionally, the signal traces 456 may be used for bonding the adjustable optical filter 200 to the substrate 342.

The adjustable optical filter 200 may be located on a top surface 448 of the substrate 342. The adjustable optical filter 200 may be positioned perpendicular to the substrate 342 so that a first surface 236 and a second surface 240 of the optical filter die 230 are positioned perpendicular to the top surface 448 of the substrate 342. In some embodiments, the top surface 448 may be configured as a solder resist and/or an insulating layer for attaching components via silver glue. In these and other embodiments, the top surface 448 may include silicon dioxide (SiO2), silicon nitride (SiN), or any other suitable material.

The adjustable optical filter 200 may be bonded to the substrate 342 in a manner that thermally isolates the adjustable optical filter 200 from the substrate 342. In some embodiments, the adjustable optical filter 200 may be bonded to the substrate 324 so as to allow the first surface 236 and the second surface of the optical filter die 320 to transfer heat from the adjustable optical filter 200 to a surrounding environment more quickly and efficiently.

Thermally isolating the adjustable optical filter 200 from the substrate 342 and/or other devices may reduce power consumption of the adjustable optical filter sub-assembly 400. Likewise, thermally isolating the adjustable optical filter 200 may permit a more simplified design and lower production cost of the adjustable optical filter 200, which may not include a fragile membrane structure which may increase mechanical stability of the adjustable optical filter 200.

Figure 5:
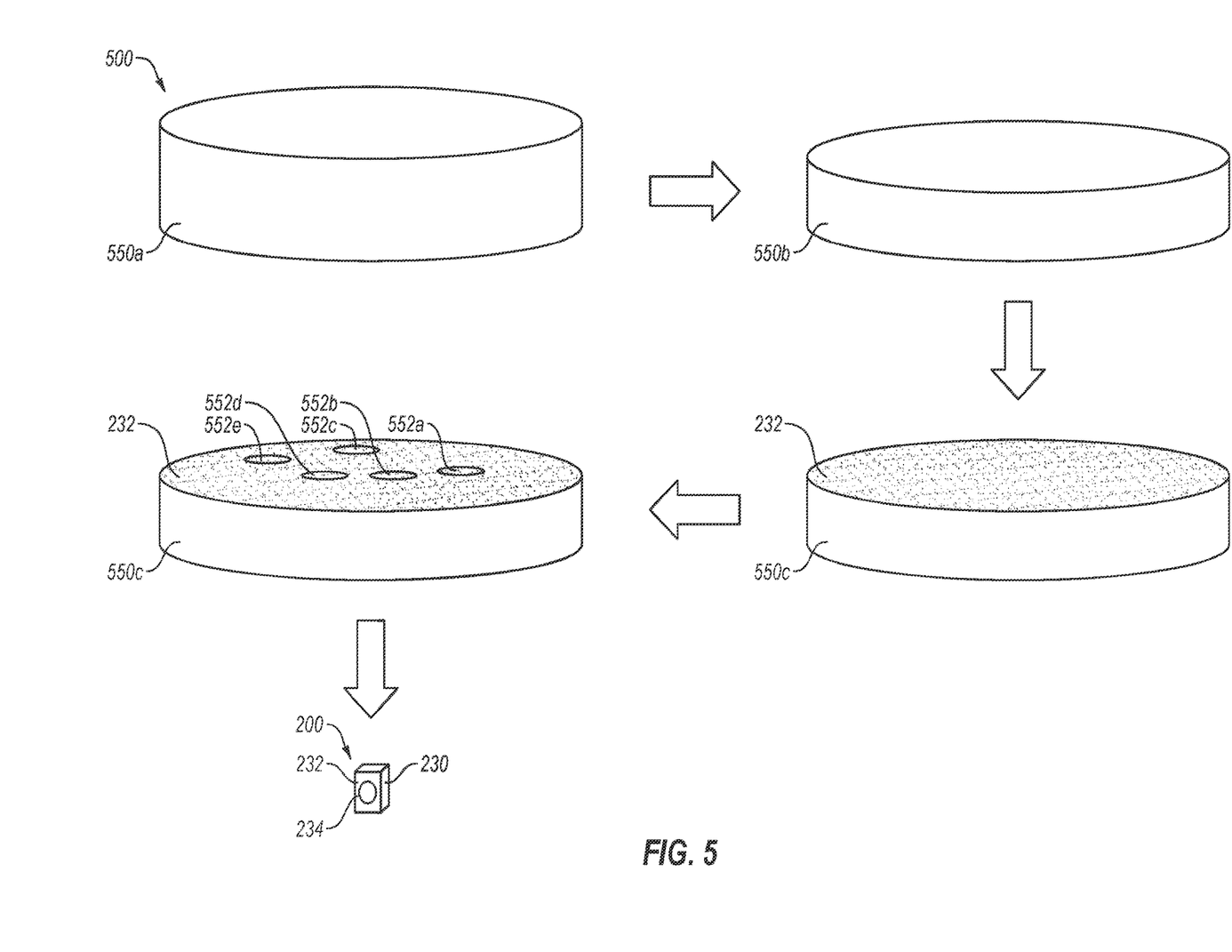
FIG. 5 illustrates a process diagram to produce an adjustable optical filter.

FIG. 5 illustrates a process diagram 500 to produce an adjustable optical filter 200, according to at least one embodiment described in the present disclosure. The adjustable optical filter 200 may be employed to filter optical signals. In some embodiments, the adjustable optical filter 200 may permit a frequency range of the optical signal to pass through the adjustable optical filter 200. Although illustrated as individual sections, the processes and operations associated with one or more of the blocks of the process diagram 500 may be divided into additional sections, combined into fewer sections, or eliminated, depending on the particular implementation.

A silicon wafer 550a may be obtained with an initial thickness. For example, the initial thickness may be 0.7 mm. Additionally, the silicon wafer 550a may be obtained with an initial diameter. For example, the initial diameter may be 150 mm (e.g., 6 inches), 200 mm (e.g., 8 inches), 300 mm (e.g., 12 inches), or any other suitable diameter. The silicon wafer 550a may be thinned to produce a thinned silicon wafer 550b with a particular thickness. In some embodiments, the particular thickness may be based a passband frequency spectrum that is to pass through the thinned silicon wafer 550a. Additionally, parallelism of a first surface and a second surface of the thinned silicon wafer 550b opposite the first surface may be verified. Parallelism of the first surface and the second surface of the thinned silicon wafer 550b may ensure that the frequency spectrum of the optical signals that are to pass through the thinned silicon wafer 550a and is not filtered out.

An optical coating 232 may be disposed on the first surface of the thinned silicon wafer 550b to produce a coated thinned silicon wafer 550c. Additionally or alternatively, the optical coating 232 may be disposed on both the first surface and the second surface of the thinned silicon wafer 550b. Multiple thermal tuning components 552a-e may be deposited on the coated thinned silicon wafer 550c. The thermal tuning components 552a-e may include multiple ring heaters, thermistors, and thermal contact pads, which may be the same or similar to the ring heaters, the thermistors, and the thermal contact pads discussed above in relation to FIGS. 2A and 2B. The thermal tuning components 552a-e may be used to modify a frequency range that passes through the adjustable optical filter 200 by modifying a temperature of the optical filter die and/or the optical coating.

The coated thinned silicon wafer 550c including the multiple thermal tuning components 552a-e may be divided into multiple adjustable optical filters 200. The coated thinned silicon wafer 550c including the multiple thermal tuning components 552a-e may be divided such that each adjustable optical filter 200 includes an optical filter die, a ring heater, at least one thermistor, and at least one thermal contact pad.

Figure 6:
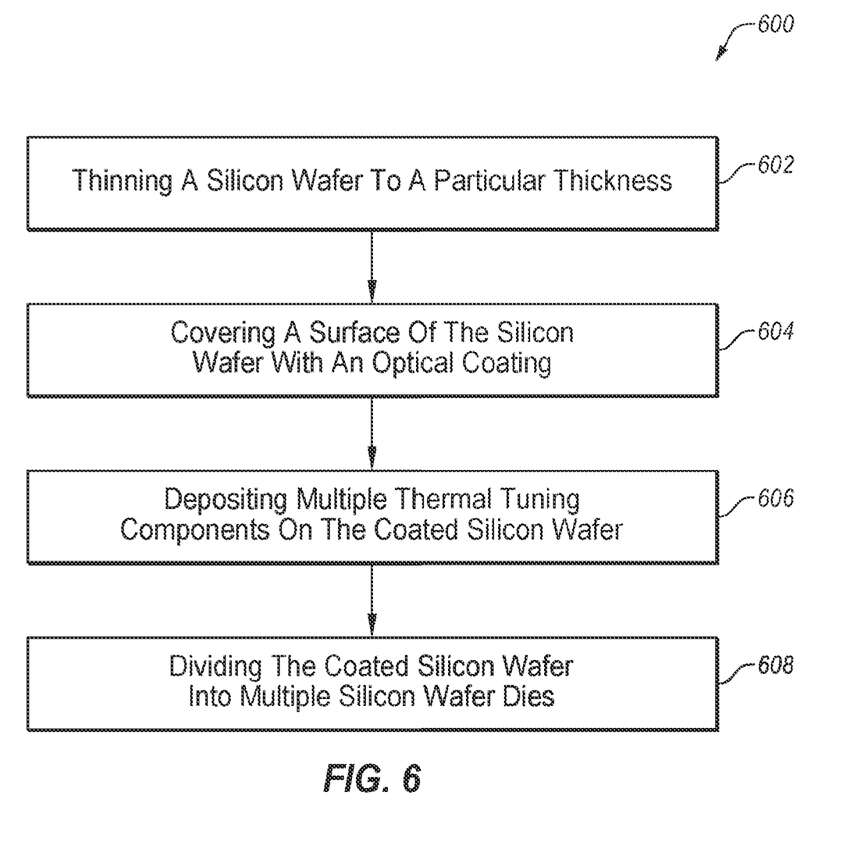
FIG. 6 illustrates a flowchart of a method to produce an adjustable optical filter.

FIG. 6 illustrates a flowchart of a method 600 to produce an adjustable optical filter, according to at least one embodiment described in the present disclosure. Although illustrated with discrete blocks, the steps and operations associated with one or more of the blocks of the method 600 may be divided into additional blocks, combined into fewer blocks, or eliminated, depending on the particular implementation.

The method 600 may include a block 602, at which a silicon wafer may be thinned to a particular thickness. The particular thickness may be based on a passband frequency spectrum of the adjustable optical filter.

At block 604, a surface of the silicon wafer may be covered with an optical coating. The optical coating may be configured to filter an optical signal. The optical coating may also be configured based on the passband frequency spectrum.

At block 606, multiple thermal tuning components may be deposited on the coated silicon wafer. The thermal tuning components may be configured to adjust a passband frequency range of the adjustable optical filter by adjusting a temperature of the coated silicon wafer. The passband frequency range may be within the passband frequency spectrum.

At block 608, the coated silicon wafer may be divided into multiple silicon wafer dies. Each silicon wafer die may include multiple thermal tuning components. Each silicon wafer die may also be configured as the adjustable optical filter.

Modifications, additions, or omissions may be made to the method 600 without departing from the scope of the present disclosure. For example, the operations of method 600 may be implemented in differing order. Additionally or alternatively, two or more operations may be performed at the same time. Furthermore, the outlined operations and actions are only provided as examples, and some of the operations and actions may be optional, combined into fewer operations and actions, or expanded into additional operations and actions without detracting from the essence of the disclosed embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A system comprising:
   an adjustable optical filter comprising:

a silicon wafer die having a thickness that is based on a passband frequency spectrum of the adjustable optical filter;

an optical coating disposed on a first surface of the silicon wafer die, wherein the optical coating is configured to filter an optical signal and is configured based on the passband frequency spectrum;

a ring heater integrated with the silicon wafer die and configured to adjust a temperature of the silicon wafer die based on an electrical signal to adjust a passband frequency range of the adjustable optical filter, wherein the passband frequency range is within the passband frequency spectrum;

a thermal contact pad integrated with the silicon wafer die and coupled to the ring heater and configured to receive the electrical signal and pass the electrical signal to the ring heater; and a thermistor integrated with the silicon wafer die and configured to monitor the temperature of the silicon wafer die, wherein the electrical signal is modified based on the monitored temperature; and a substrate thermally isolated from the silicon wafer die and including a signal trace electrically coupled to the thermal contact pad, wherein the signal trace is configured to carry the electrical signal.

2. The system of claim 1, wherein the silicon wafer die is positioned parallel to the substrate and the substrate is further coupled to the thermistor so as to create an air gap between the silicon wafer die and the substrate so as to thermally isolate the silicon wafer die from the substrate.

3. The system of claim 2, wherein the thermal contact pad is located on a second surface of the silicon wafer die opposite the first surface of the silicon wafer die, the thermistor is located on the first surface of the silicon wafer die, and the ring heater is also located on the second surface of the silicon wafer die.

4. The system of claim 3, wherein the substrate defines a hole optically aligned with the ring heater, wherein the hole is configured to pass light to or from the silicon wafer die.

5. The system of claim 1, wherein the substrate comprises a low thermal conductivity material.

6. The system of claim 1, wherein the silicon wafer die is positioned perpendicular to the substrate so as to thermally isolate the silicon wafer die from the substrate.

7. The system of claim 6, wherein the thermal contact pad is located on a second surface of the silicon wafer die opposite the first surface of the silicon wafer die, the thermistor is located on the first surface of the silicon wafer die, and the substrate is coupled to a third surface of the silicon wafer die, wherein the third surface of the silicon wafer die is not parallel to the first surface or the second surface of the silicon wafer die.

8. The system of claim 1, wherein the first surface of the silicon wafer die comprises a polished first surface and the silicon wafer die further comprises a polished second surface opposite the polished first surface.

9. An adjustable optical filter comprising:

an optical filter die including a polished first surface and a polished second surface opposite the polished first surface having a thickness that is based on a passband frequency spectrum of the adjustable optical filter;

an optical coating disposed on the polished first surface of the optical filter die, wherein the optical coating is configured to filter an optical signal and is configured based on the passband frequency spectrum;

a ring heater integrated with the optical filter die and configured to adjust a temperature of the optical filter die based on an electrical signal to adjust a passband frequency range of the adjustable optical filter, wherein the passband frequency range is within the passband frequency spectrum;

a thermal contact pad integrated with the optical filter die and coupled to the ring heater and configured to receive the electrical signal and pass the electrical signal to the ring heater; and a thermistor mechanically coupled with the optical filter die and configured to monitor the temperature of the optical filter die, wherein the electrical signal is modified based on the monitored temperature.

10. The adjustable optical filter of claim 9, wherein a thickness of the optical filter die is between two micrometers-15 millimeters.

11. The adjustable optical filter of claim 9, wherein the optical filter die includes at least one of a Gallium Arsenide, an Indium Phosphide, and a glass material.

12. The adjustable optical filter of claim 9, wherein the polished first surface and the polished second surface of the optical filter die are parallel.

* * * * *